US006909650B2

United States Patent
Ryu et al.

(10) Patent No.: US 6,909,650 B2
(45) Date of Patent: Jun. 21, 2005

(54) CIRCUIT AND METHOD FOR TRANSFORMING DATA INPUT/OUTPUT FORMAT IN PARALLEL BIT TEST

(75) Inventors: Jin-ho Ryu, Anyang (KR); Choong-sun Shin, Seongnam (KR); Yong-gyu Chu, Gunpo (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/716,773

(22) Filed: Nov. 19, 2003

(65) Prior Publication Data

US 2004/0130952 A1 Jul. 8, 2004

(30) Foreign Application Priority Data

Nov. 20, 2002 (KR) .................................. 10-2002-0072477

(51) Int. Cl.[7] .......................... G11C 29/00; G11C 7/00
(52) U.S. Cl. ....................................... 365/201; 365/220
(58) Field of Search ................................. 365/201, 220, 365/189.12, 240

(56) References Cited

U.S. PATENT DOCUMENTS 6,064,601 A * 5/2000 Yoo et al. ................... 365/201
6,567,939 B1 * 5/2003 Kim ........................... 365/201
6,636,998 B1 * 10/2003 Lee et al. .................... 365/201

* cited by examiner

*Primary Examiner*—Trong Phan
(74) *Attorney, Agent, or Firm*—Mills & Onello LLP

(57) ABSTRACT

Provided are a circuit and a method for transforming a data input/output format of a semiconductor memory device which is capable of generating various types of data patterns when the number of memory cells connected to one column selection line is greater than the number of data input pins. The circuit for transforming a data input/output format of a semiconductor memory device includes a first transmission circuit, a second transmission circuit, and a mode register set (MRS). The first transmission circuit is activated when a first test mode signal is enabled, receives n data inputs from n data input ends, and transmits the n data inputs to m memory cells. Here, n and m are natural numbers and m is greater than n. The second transmission circuit is activated when a second test mode signal is enabled, receives n data inputs from the n data input ends, and transmits the n data inputs to the m memory cells. The mode register set (MRS) receives a command and an address from outside the semiconductor device and outputs the first test mode signal and the second test mode signal according to combinations of the command and the address. In particular, data that is transmitted to adjacent memory cells of the m memory cells is inputted to different input ends of the n data input ends.

7 Claims, 2 Drawing Sheets

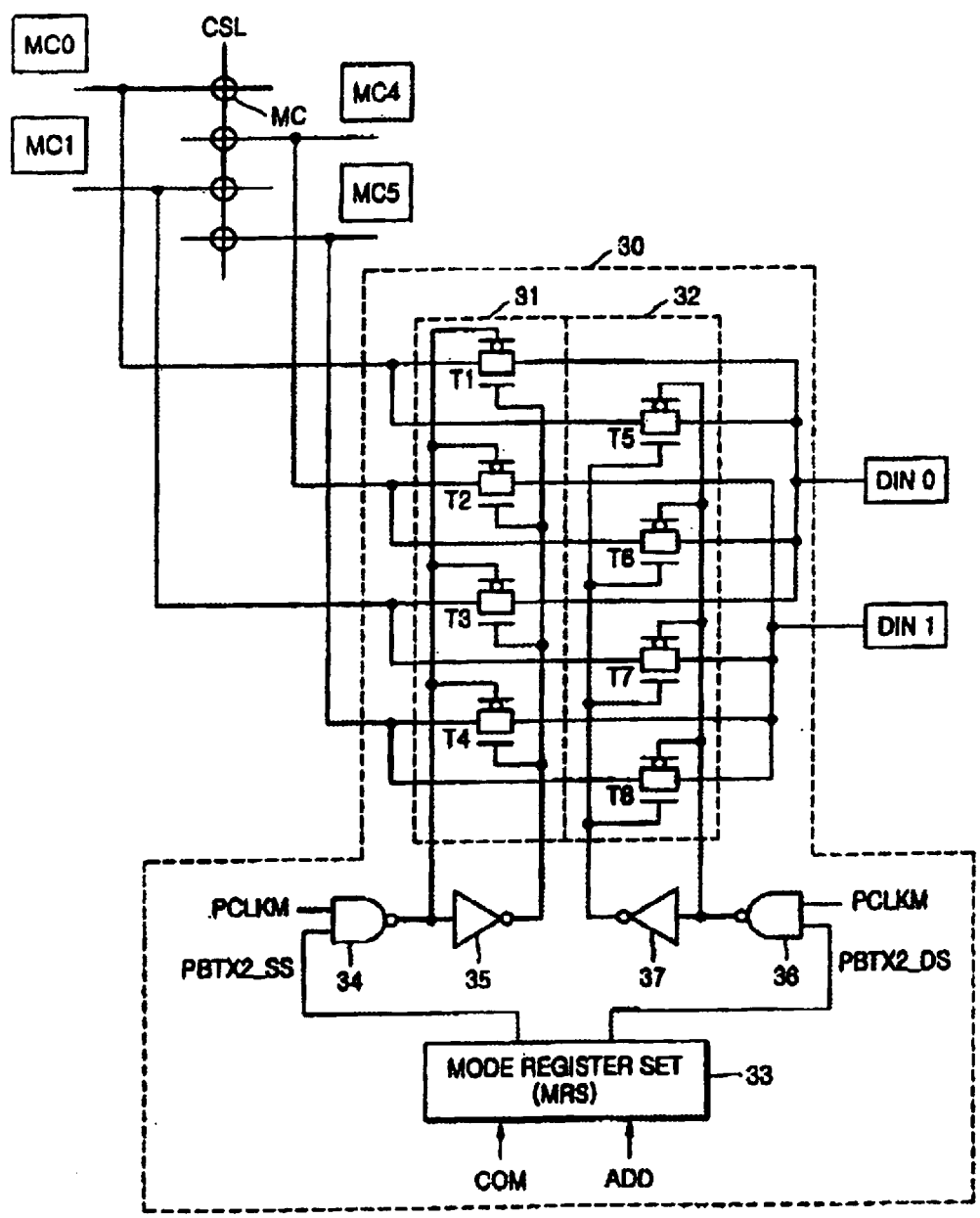

CIRCUIT AND METHOD FOR TRANSFORMING DATA INPUT/OUTPUT FORMAT IN PARALLEL BIT TEST

This application claims priority from Korean Patent Application No. 2002-72477, filed on Nov. 20, 2002, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a circuit and a method for transforming a data input/output format in a parallel bit test (PBT).

2. Description of the Related Art

A parallel bit test (PBT) is used to check failures of memory cells and write/read paths by writing and reading data to and from the memory cells of a semiconductor memory device in parallel. If the number of data input/output pins (DQ) is reduced in the parallel bit test (PBT), more memory devices can be tested at the same time. For example, if 16 monitoring pins can be used in test equipment, two X8 mode memory devices, four X4 mode memory devices, or eight X2 mode memory devices can be tested in the test equipment.

Therefore, it is advantageous in terms of time and costs to test memory devices using the PBT with a decreased number of data input/output pins DQ. In general, a circuit for transforming a data input/output format is used to reduce the number of data input/output pins (DQ) in the PBT.

FIG. 1 is a view of a X4 data input/output format, and FIG. 2 is a view of a conventional circuit for transforming a data input/output format from a X4 mode to a X2 mode. If the number, of memory cells (MC), e.a., MC1, MC2, MC4, MC5, connected to a column select line CSL is equal to the number of data input pins DIN0–DIN3, no problems occur. That is, all types of data patterns can be tested by writing and reading the data patterns to and from four memory cells MC1, MC2, MC4, MC5, while using four data input pins DIN0–DIN3.

However, in the circuit of FIG. 2, two memory cells are connected to one data input pin through a circuit 20 for transforming a data input/output format. That is, two memory cells MC0 and MC1 are connected to a data input pin DIN0, and two memory cells MC4 and MC5 are connected to a data input pin DIN1. As a result, the number of memory cells MC0, MC1, MC4, MC5 connected to one column selection line CSL is greater than the number of data input pins DIN0 and DIN1.

In this case, the types of data patterns that can be written to the memory cells MC0–MC5 are limited. The following Table 1 shows types of data patterns that can be written to the memory cells MC1, MC2, MC4, MC5 in the circuit of FIG. 2.

TABLE 1

| Memory cell | Data pattern | | | |
|---|---|---|---|---|
| MC0 | 0 | 0 | 1 | 1 |
| MC1 | 0 | 0 | 1 | 1 |
| MC4 | 0 | 1 | 0 | 1 |
| MC5 | 0 | 1 | 0 | 1 |

However, when data patterns of Table 1 are used, it is impossible to check failures between two adjacent input/output lines, e.g., between an input/output line connected to the memory cell MC0 and an input/output line connected to the memory cell MC1 or between an input/output line connected to the memory cell MC4 and an input/output line connected to the memory cell MC5.

This is because it is impossible to generate a data pattern, which can be written with different data in the memory cells MC0 and MC1 or MC4 and MC5, i.e., (0,1,0,1) or (1,0,1,0), by the conventional circuit 20 for transforming an input/output format shown in FIG. 2.

SUMMARY OF THE INVENTION

The present invention provides a circuit for transforming a data input/output format which is capable of generating various data patterns when the number of memory cells connected to one column selection line is greater than the number of data input pins.

According to an aspect of the present invention, there is provided a circuit for transforming a data input/output format of a semiconductor memory device. The circuit comprises a first transmission circuit which is activated when a first test mode signal is enabled, receives n data inputs from n data input ends, and transmits the n data inputs to m memory cells, wherein n and m are natural numbers and m is greater than n. A second transmission circuit is activated when a second test mode signal is enabled, receives n data inputs from the n data input ends, and transmits the n data inputs to the m memory cells. Data that is transmitted to adjacent memory cells of the m memory cells is inputted to different input ends of the n data input ends.

In one embodiment, he circuit further comprises a command register which receives a command and an address from outside the semiconductor device and outputs the first test mode signal and the second test mode signal according to combinations of the command and the address. It is preferable that the command register is a mode register set (MRS).

In one embodiment, the first transmission circuit comprises m switches which connect the n data input ends with the m memory cells in response to the first test mode signal.

In one embodiment, the second transmission circuit comprises m switches which connect the n data input ends with the m memory cells in response to the second test mode signal.

According to another aspect of the present invention, there is provided a method for transforming a data input/output format of a semiconductor memory device. The method comprises enabling a first test mode signal, receiving n data inputs from n data input ends and transmitting the n data inputs to m memory cells while the first test mode signal is enabled, wherein n and m are natural numbers and m is greater than n, and receiving n data inputs from the n data input ends and transmitting the n data inputs to the m memory cells while the second test mode signal is enabled. Data that is transmitted to adjacent memory cells of the m memory cells is input to different input ends of the n data input ends.

In one embodiment, the method further comprises receiving a command and an address from outside the semiconductor memory device and generating the first test mode signal and the second test mode signal according to combinations of the command and the address.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 3 is a view of a circuit for transforming data input/output format according to an embodiment of the present invention.

DETAILED DESCRIPTION OF THE INVENTION

Figure 1:
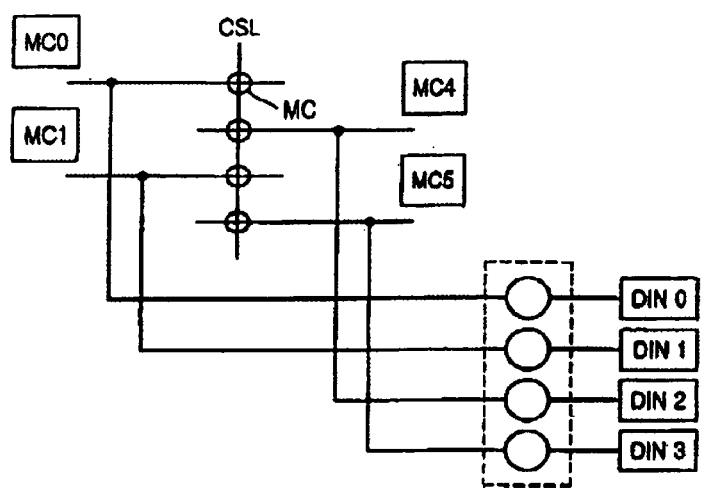
FIG. 1 is a schematic diagram of X4 data input/output format.

The present invention now will be described more fully with reference to the accompanying drawings, in which preferred embodiments of the invention are shown.

FIG. 3 is a view of a circuit for transforming data input/output format according to an embodiment of the present invention.

Referring to FIG. 3, a circuit 30 for transforming a data input/output format according to an embodiment of the present invention includes a first transmission circuit 31, a second transmission circuit 32, a mode register set (MRS) 33, NAND gates 34 and 36, and inverters 35 and 37.

The first transmission circuit 31 is activated when a first test mode signal PBTX2_SS is enabled as logic high, receives two data inputs from two data input ends DIN0 and DIN1, and transmits the data inputs to four memory cells (MC) MC0, MC1, MC4, and MC5. The second transmission circuit 32 is activated when a second test mode signal PBTX2_DS is enabled as logic high, receives two data inputs from two data input ends DIN0 and DIN1, and transmits the data inputs to four memory cells MC0, MC1, MC4, and MC5. Here, a signal PCLKM is maintained as logic high.

In particular, data transmitted to adjacent memory cells of the memory cells MC0, MC1, MC4, and MC5 is inputted to different input ends DIN0 or DIN1.

The mode register set (MRS) 33 receives a command COM and an address ADD from outside the semiconductor memory device and outputs the first test mode signal PBTX2_SS and the second test mode signal PBTX2_DS according to combinations of the command COM and the address ADD.

More specifically, the first transmission circuit 31 includes four switches T1 through T4 which connect two data input ends DIN0 and DIN1 with four memory cells MC0, MC1, MC4, and MC5 in response to the enabling of the first test mode signal PBTX2_SS. The four switches T1 through T4 are each composed of a CMOS transmission gate.

The switch T1 connects the data input end DIN0 with the memory cell MC0 in response to the enabling of the first test mode signal PBTX2_SS. The switch T2 connects the data input end DIN1 with the memory cell MC4 in response to the enabling of the first test mode signal PBTX2_SS. The switch T3 connects the data input end DIN0 with the memory cell MC1 in response to the enabling of the first test mode signal PBTX2_SS. The switch T4 connects the data input end DIN1 with the memory cell MC5 in response to the enabling of the first mode signal PBTX2_SS.

The second transmission circuit 32 includes four switches T5 through T8 which connect two input ends DIN0 and DIN1 with four memory cells MC0, MC1, MC4, and MC5 in response to the enabling of the second test mode signal PBTX2_DS. The switches T5 through T8 are each composed of a CMOS transmission gate.

The switch T5 connects the data input end DIN0 with the memory cell MC0 in response to the enabling of the second test mode signal PBTX2_DS. The switch T6 connects the data input end DIN0 with the memory cell MC4 in response to the enabling of the second test mode signal PBTX2_DS. The switch T7 connects the data input end DIN1 with the memory cell MC1 in response to enabling of the second test mode signal PBTX2_DS. The switch T8 connects the data input end DIN1 with the memory cell MC5 in response to the enabling of the second test mode signal PBTX2_DS.

The following Table 2 shows types of data patterns which can be written in memory cells MC0, MC1, MC4, and MC5 in the circuit of FIG. 3 according to the present invention. In the circuit according to the present invention, various types of data patterns, which can be written in the memory cells MC0, MC1, MC4, and MC5, can be generated by controlling states of the first test mode signal PBTX2_SS and the second test mode signal PBTX2_DS.

TABLE 2

| Memory cell | DIN0/DIN1 (PBTX2_SS = 1, PBTX2_DS = 0) | | | | DIN0/DIN1 (PBTX2_SS = 0, PBTX2_DS = 1) | | | |
|---|---|---|---|---|---|---|---|---|
| | 0/0 | 0/1 | 1/0 | 1/1 | 0/0 | 0/1 | 1/0 | 1/1 |
| MC0 | 0 | 0 | 1 | 1 | 0 | 0 | 1 | 1 |
| MC1 | 0 | 0 | 1 | 1 | 0 | 1 | 0 | 1 |
| MC4 | 0 | 1 | 0 | 1 | 0 | 0 | 1 | 1 |
| MC5 | 0 | 1 | 0 | 1 | 0 | 1 | 0 | 1 |

For example, when PBTX2_SS is logic "1" and PBTX2_DS is logic "0", the switches T1 through T4 of the first transmission circuit 31 are turned on, and the switches T5 through T8 of the second transmission circuit 32 are turned off. Thus, the data input end DIN0 and the memory cell MC0 are connected with each other, the data input end DIN1 and the memory cell MC4 are connected with each other, the data input end DIN0 and the memory cell MC1 are connected with each other, and the data input end DIN1 and the memory cell MC5 are connected with each other. Therefore, four types of data patterns, i.e., (0,0,0,0), (0,0,1,1,), (1,1,0,0), and (1,1,1,1), can be generated according to the four cases where data input ends DIN0 and DIN1 are connected with the memory cells MC0, MC1, MC4, and MC5.

When PBTX2_SS is logic "0" and PBTX2_DS is logic "1", the switches T1 through T4 of the first transmission circuit 31 are turned off, and the switches T5 through T8 of the second transmission circuit 32 are turned on. Thus, the data input end DIN0 and the memory cell MC0 are connected with each other, the data input end DIN0 and the memory cell MC4 are connected with each other, the data input end DIN1 and the memory cell MC1 are connected with each other, and the data input end DIN1 and the memory cell MC5 are connected with each other. Therefore, four types of data patterns, i.e., (0,0,0,0), (0,1,0,1,), (1,0,1,0), and (1,1,1,1), can be generated according to the four cases where data input ends DIN0 and DIN1 are connected with the memory cells MC0, MC1, MC4, and MC5.

Figure 2:
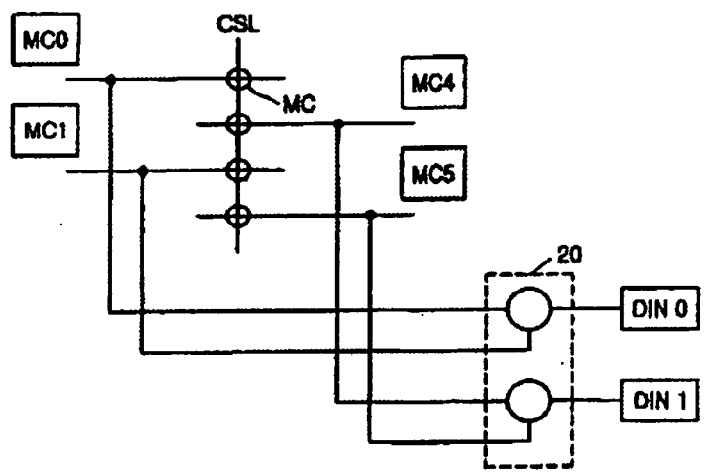
FIG. 2 is a schematic diagram of a conventional circuit for transforming data input/output format from a X4 mode to a X2 mode in a parallel bit test.

As described above, in the circuit for transforming a data input/output format according to the present invention, various types of data patterns can be generated. In particular, it is possible to generate data patterns that can be written with different data in the memory cells MC4 and MC5, i.e., (0,1,0,1) or (1,0,1,0), which is contrary to the conventional circuit 20 for transforming an input/output format shown in FIG. 2.

Therefore, it is possible to check failures between two input/output lines, e.g., between the input/output line connected to the memory cell MC0 and the input/output line connected to the memory cell MC1 or between the input/output line connected to the memory cell MC4 and the input/output line connected to the memory cell MC5.

According to a circuit for transforming a data input/output format according to the present invention, it is possible to generate various types of data patterns when the number of memory cells connected to one column selection line is greater than the number of data input pins. Therefore, various failures can be checked by the circuit for transforming a data input/output format according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A circuit for transforming a data input/output format of a semiconductor memory device, the circuit comprising:

a first transmission circuit which is activated when a first test mode signal is enabled, receives n data inputs from n data input ends, and transmits the n data inputs to m memory cells, wherein n and m are natural numbers and m is greater than n; and a second transmission circuit which is activated when a second test mode signal is enabled, receives n data inputs from the n data input ends, and transmits the n data inputs to the m memory cells, wherein data that is transmitted to adjacent memory cells of the m memory cells is inputted to different input ends of the n data input ends.

2. The circuit of claim 1 further comprising a command register which receives a command and an address from outside the semiconductor device and outputs the first test mode signal and the second test mode signal according to combinations of the command and the address.

3. The circuit of claim 2, wherein the command register is a mode register set (MRS).

4. The circuit of claim 1, wherein the first transmission circuit comprises m switches which connect the n data input ends with the m memory cells in response to the first test mode signal.

5. The circuit of claim 1 wherein the second transmission circuit comprises m switches which connect the n data input ends with the m memory cells in response to the second test mode signal.

6. A method for transforming a data input/output format of a semiconductor memory device, the method comprising:

enabling a first test mode signal;

receiving n data inputs from n data input ends and transmitting the n data inputs to m memory cells while the first test mode signal is enabled, wherein n and m are natural numbers and m is greater than n; and receiving n data inputs from the n data input ends and transmitting the n data inputs to the m memory cells while the second test mode signal is enabled, wherein data that is transmitted to adjacent memory cells of the m memory cells is input to different input ends of the n data input ends.

7. The method of claim 6 further comprising receiving a command and an address from outside the semiconductor memory device and generating the first test mode signal and the second test mode signal according to combinations of the command and the address.

* * * * *